United States Patent [19]

Yamashita et al.

[11] Patent Number: 5,191,465
[45] Date of Patent: Mar. 2, 1993

[54] OPTICAL APPARATUS FOR ALIGNMENT OF RETICLE AND WAFER IN EXPOSURE APPARATUS

[75] Inventors: Kazuhiro Yamashita, Amagasaki; Noboru Nomura, Kyoto, both of Japan

[73] Assignee: Matsushita Electric Industrial Co., Ltd., Osaka, Japan

[21] Appl. No.: 759,041

[22] Filed: Sep. 5, 1991

Related U.S. Application Data

[63] Continuation of Ser. No. 501,257, Mar. 28, 1990, abandoned.

[51] Int. Cl.$^5$ .......................... G01B 9/02; G02B 5/18; G02F 1/11
[52] U.S. Cl. .................................. 359/287; 356/363; 359/566
[58] Field of Search .................. 356/349, 356, 363; 359/559, 562, 563, 285, 287, 566

[56] References Cited

U.S. PATENT DOCUMENTS

| | | | |
|---|---|---|---|
| 4,332,473 | 6/1982 | Ono | 356/363 |
| 4,631,416 | 12/1986 | Trutna, Jr. | 356/356 |
| 4,636,077 | 1/1987 | Nomura et al. | 356/356 |
| 4,655,594 | 4/1987 | Wittekoek et al. | 356/363 |
| 4,710,026 | 12/1987 | Magome et al. | 356/349 |
| 4,771,180 | 9/1988 | Nomura et al. | 250/548 |
| 4,815,850 | 3/1989 | Kanayama et al. | 356/356 |
| 4,828,392 | 5/1989 | Nomura et al. | 356/401 |
| 4,902,133 | 2/1990 | Jojo et al. | 356/356 |
| 4,912,530 | 3/1990 | Bessho | 356/349 |
| 5,070,250 | 12/1991 | Komatsu et al. | 356/363 |

FOREIGN PATENT DOCUMENTS

| | | |
|---|---|---|
| 1-82622 | 3/1989 | Japan . |
| 1-82624 | 3/1989 | Japan . |
| 1-82625 | 3/1989 | Japan . |
| 1-83101 | 3/1989 | Japan . |

OTHER PUBLICATIONS

S. Katagiri, K. Katooka & T. Kurosaki; "Alignment Method Using Heterodyne Interference of Diffraction Lights from Marks for Optical Projection" in Extended Abstracts of JSAP at p. 560 (Item 1a-k-8, 36th Spring Meeting, 1989).

N. Magome, H. Mizutani, K. Ota & K. Komatsu; "Optical Heterodyne Alignment Technique for Optical Stepper" in Extended Abstracts of JSAP at p. 512 (Item 29a-L-2, 1989).

M. Tabota & T. Tojo; "High-Precision Interferometric Alignment Using Checker Grating" in J. Vac. Sci. Technol. B7(6) at 1980-83 (Nov./Dec. 1989).

J. Itoh, T. Kanayama, N. Atoda & K. Hoh; "A New Mask-to-Wafer Alignment Technique for Synchrotron Radiation X-Ray Lithography" in SPIE, vol. 773, Electron-Beam, X-Ray and Ion-Beam Lithographics VI at 7-15 (1987).

M. Suzuki & A. Une; "An Optical-Heterodyne Alignment Technique for Quater-Micron X-Ray Lithography", in J. Vac. Sci Technol. B7(6) at 1971-76 (Nov./Dec. 1989).

S. Witterkock & J. Van der Werf; "Phase Gratings as Waferstepper Alignment Marks for All Process Layers" in SPIE, vol. 538, Optical Microlithography Vat 24-31 (1985).

W. R. Trutna, Jr.; "An Improved Alignment System for the Wafer Steppers" in SPIE 470 Optical Microlithography III: Technology for the Next Decade at 62-69 (1984).

*Primary Examiner*—Martin Lerner
*Attorney, Agent, or Firm*—Ratner & Prestia

[57] ABSTRACT

An optical apparatus for aligning a reticle and a wafer together in connection with reduction projection onto the wafer of an image of a circuit pattern formed on the reticle. Two light beams having slightly different frequencies are concurrently applied to alignment gratings on the reticle and alignment gratings on the wafer through the windows on the reticle and a reduction projection lens. Heterodyne signals of interference rays resulting from diffraction by the alignment gratings on the reticle of the light applied to the alignment gratings are caught by a first optical sensor. Heterodyne signals of interference rays resulting from diffraction by the alignment gratings on the wafer of the light applied to the alignment gratings are caught by a second optical sensor. The difference in phase of the heterodyne signals detected by the respective optical sensors is detected by a phase meter, and the position of the wafer relative to the reticle is adjusted so that the phase difference is reduced to zero.

6 Claims, 18 Drawing Sheets

| ERROR FACTORS | ERRORS (nm/3σ) |
|---|---|
| REPEATABILITY OF ALIGNMENT TWO-FLUX INTERFERENCE FRINGES | 10 |
| MANUFACTURE ERRORS OF ALIGNMENT GRATING | 33 |
| POSITIONAL CONTROL OF X- Y- DIRECTION FINE ADJUST STAGE | 20 |
| θ-DIRECTION ORIENTED ROUGH SHIFTING STAGE | 0 |
| ALIGNMENT SEQUENCE | 0 |
| RETICLE ROTATION | 0 |
| RETICLE RUN-OUT | 30 |
| TOTAL (3σ) | 50 |

FIG. 7

| ERROR FACTORS | ERRORS (nm/3σ) |
|---|---|
| REPEATABILITY OF ALIGNMENT TWO-FLUX INTERFERENCE FRINGES | 10 |
| MANUFACTURE ERRORS OF ALIGNMENT GRATING | 33 |
| POSITIONAL CONTROL OF X-, Y- DIRECTION FINE ADJUST STAGE | 30 |
| θ-DIRECTION ORIENTED ROUGH SHIFTING STAGE | 0 |
| ALIGNMENT SEQUENCE | 30 |
| RETICLE ROTATION | 0 |
| RETICLE RUN-OUT | 30 |
| TOTAL (3σ) | 62 |

FIG. 12

EXPOSURE REGION

OPTICAL APPARATUS FOR ALIGNMENT OF RETICLE AND WAFER IN EXPOSURE APPARATUS

This application is a continuation of application Ser. No. 07/501,257 filed on Mar. 28, 1990 now abandoned.

BACKGROUND OF THE INVENTION

1. Field of the Invention

The present invention relates to an optical apparatus for use in the alignment of a wafer and a reticle in connection with reduction projection exposure of a circuit pattern or the like formed on the reticle to a resist coated on the wafer.

2. Description of the Prior Art

In order to improve the accuracy of reticle-wafer alignment, as disclosed in U.S. Pat. No. 4,771,180, for example, there has been proposed a method utilizing the two light flux interference technique. In this method, as shown in FIG. 17, for alignment of a wafer 110 and a reticle 120 having a circuit pattern thereon an alignment grating 121 is provided on the reticle 120. A light ray 122 illuminated from an alignment light source is directed to the alignment grating 121. The light ray 122 applied to the alignment grating 121 is diffracted by the alignment grating 121 and the diffracted light is projected onto the wafer 110 on a wafer stage 150 via an optical alignment system 130 and a reduction projection lens 140.

The optical alignment system 130, as shown in FIG. 18a, includes a pair of Fourier transform lenses 131 and 132, a spatial filter 133, and three mirrors 134, 135, and 136. This optical alignment system 130 selects ± primary rays only of the diffracted rays resulting from the light incident on the alignment grating 121 on the reticle 120 through the intermediary of the pair of Fourier transform lenses 131, 132 and the spatial filter 133, to cause those rays to intersect each other at post-focal points of the Fourier transform lenses 131 and 132 thereby to produce interference fringes. The rays from the optical alignment system 130 are projected onto the wafer 110 through the reduction projection lens 140.

As shown in FIG. 18b an alignment grating 111 is also provided on the wafer 110, and ± primary rays 123 and 124 are diffracted by the grating 111 to produce interference, resulting in interference fringes 125, which are then detected by a light sensor 160 (see FIG. 18a) via the reduction projection lens 140 and the optical alignment system 130. Any off-alignment between the grating 111 on the wafer 110 and the interference fringes 125 is detected on the basis of the interference light detected by the light sensor 160, and the wafer 110 is shifted in relation to the reticle 120 on the basis of the results of the detection in order to bring the wafer 110 and the reticle 120 into alignment. Only after such alignment, the circuit pattern on the reticle 120 is exposed for image projection onto the wafer 110.

As above mentioned, according to the method utilizing the two light flux interference technique, the grating 121 on the reticle 120 and the grating 111 on the wafer 110 are aligned together by means of two-flux interference fringes 125, and thus high precision alignment between the reticle 120 and the wafer 110 can be achieved.

However, such method requires the provision of the optical alignment system 130 between the reticle 120 and the reduction projection lens 140. The optical alignment system 130 requires a large number of optical members including a pair of Fourier transform lenses 131 and 132 and three mirrors 134–136, which makes the arrangement of the system very complicated. With such an arrangement, therefore, it is difficult to make such optical adjustments as required for chromatic aberration correction, imagery position adjustment for interference fringes 125 formed, by the grating 121 on the reticle 120, and the like. Another problem is that positions of individual optical members in the optical alignment system 130 may change with time. Moreover, since the optical alignment system 130 is fixed relative to the reticle 120, the optical alignment system 130 will limit the range of exposure for the circuit pattern 129 on the reticle 120 when the circuit pattern 129 is exposed to light for image projection onto the wafer 110.

As already mentioned, this method has an advantage that it permits high-precision alignment of the reticle 120 with the wafer 110. However, in actual semiconductor fabrication processes, circuit patterns on many different types of reticles are placed in superposed relation for exposure to light, and accordingly it is necessary to differentiate the position for the formation of the alignment grating 121 from reticle to reticle. As FIG. 19 shows, the position of the grating 121 formed on each reticle 120 is outside an exposure area 128 of the circuit pattern and is therefore limited to areas 127a, 127b to which light rays are applied for alignment, which causes a problem that circuit pattern formation on the wafer 110 is limited.

For the purpose of aligning the reticle 120 and the wafer 110 with each other, the wafer stage 150 is shifted and any change in the optical output of interference light diffracted from the grating 111 on the wafer 110 which result from the shifting is taken as a basis for effecting the required alignment. This practice poses a problem that the S/N ratio of a detection signal with respect to the interference light may drop due to some vibration caused to the wafer stage 150. Another problem with the method is low throughput.

As a technique replacing such a method, Japanese Laid-Open Patent Publication No. 64-82625 discloses a method which utilizes the optical heterodyne interference technique in aligning a mask and a wafer in a proximity exposure apparatus, such as an X-ray aligner. In this method, as shown in FIG. 20, laser beams emitted from a Zeeman laser 311 become incident on a reference grating 312. Diffracted rays from the reference grating 312 are reflected by a mirror 313 to become incident on a Fourier transform lens 314. The Fourier transform lens 314 is provided therein with a spatial filter which selects only ± primary light rays diffracted by the reference grating 312. The ± primary light rays selected by spatial filter are applied to an alignment grating 315 on a mask 316. The mask 316 is supported by a mask stage 319 above a wafer 318 mounted on a wafer stage 320 in such a manner that the mask 316 is slightly spaced apart from the wafer 318. On the wafer 318 there is provided an alignment grating in corresponding relation to the alignment grating 315 on the mask 316. The ± primary light rays applied to the alignment grating 315 on the mask 316 are diffracted by the alignment grating 315 to produce interference. In the same way, ± primary diffracted light rays applied to the alignment grating above the wafer 318 are diffracted by the alignment grating to produce interference. The respective interference light rays from the alignment gratings become incident upon photodetectors 325 and 326 via microlenses 321 and 322 and further through phase plates 323 and 324 respectively. The photodetectors 325 and 326 detect heterodyne optical beat signals of the corresponding interference light rays, the detection results being input to a phase meter 340. The phase meter 340 detects a phase difference between the respective heterodyne optical beat signals of the interference light rays and accordingly a mask stage drive circuit 341 is controlled so as to reduce the phase difference to zero, so that the mask stage 319 is shifted toward the wafer stage 320 for alignment of the mask 316 with the wafer 318.

Since this alignment method is for alignment of the mask 316 and the wafer 318 in a proximity exposure arrangement in which the mask 316 is disposed in proximity to the wafer 318, light beams for alignment purposes are subject to multiple reflection between the mask 316 and the wafer 318. When such multiple reflection phenomena occur, as shown in FIG. 21, depending upon the gap between the mask 316 and the wafer 318, the amplitude of the heterodyne beat signals applied to the photodetector for being detected thereby is considerably lowered, which may possibly result in some error in alignment between the mask 316 and the wafer 318.

According to the method, light beams are applied to the mask 316 and the wafer 318 from a particular direction so that the light beams to which the circuit pattern on the mask 316 is exposed for projection onto the wafer 318 will not be interrupted. Therefore, respective alignment gratings on the mask 316 and wafer 318 are limited in their positions, and accordingly the circuit pattern formed on the mask 316 is subject to a positional limitation.

Moreover, alignment precision with respect to the mask 316 and wafer 318 depends upon the pitch of two-beam interference fringes formed on the respective alignment gratings of the mask 316 and wafer 318. High-precision alignment of the mask 316 with the wafer 318 is not possible unless the pitch of two-beam interference fringes is 2 μm or less. Therefore, a Fourier transform lens 314 having high resolving power is required, which is a disadvantageous factor from the standpoint of economy.

In contrast to such an alignment method utilizing optical heterodyne interference in the proximity exposure technique, there has been reported a method utilizing optical heterodyne interference in the reduction projection exposure technique (see Extended Abstracts of JSAP, The 36th spring meeting (1989), 1a-K-8, P.560). According to this method, as shown in FIG. 22, laser beams emitted from a He-Ne two-frequency laser 230 are switched over by a shutter 260 from beams directed toward an alignment grating 221 on a reticle 220 to beams directed toward an alignment grating 211 on a wafer 210 mounted on a wafer stage 250, and vice versa. One part of the beams to be switched over by the shutter 260 is emitted toward the alignment grating 221 on the reticle 220, while the other part of the beams is emitted toward the alignment grating 211 on the wafer 210 after passing through a slit 222 formed in a reticle 247 and further passing through a reduction projection lens 240. Then ± primary light beams diffracted by the respective alignment gratings 211 and 221 pass sequentially through a color correction lens 271, a lens 272, a polarization beam splitter 273, a lens 274, a polarizing plate 275, and a slit 276 until they become incident on a photoelectric conversion device 277. Alignment of the reticle 220 with the wafer 210 is carried out on the basis of the difference in phase between the respective light beams as detected by the photoelectric conversion device 277.

This method involves a problem that since beams emitted toward the alignment grating 221 on the reticle 220 and beams emitted toward the alignment grating 211 on the wafer 210 are switched over by the shutter 260 between the former and the latter, a throughput drop is likely to occur. Another problem with the method, as has been reported, is that any light having a plane of polarization unnecessary for alignment may possibly become included in the alignment light beams to cause lowered alignment precision.

SUMMARY OF THE INVENTION

The optical apparatus of this invention, which overcomes the above-discussed and numerous other disadvantages and deficiencies of the prior art, is an optical apparatus for aligning a reticle and a wafer with each other in connection with reduction projection onto the wafer of a circuit pattern formed on the reticle, comprises: an optical alignment system for directing two alignment-oriented beams slightly differing in frequency and able to interfere with each other, through windows provided in the reticle and further through a reduction projection lens, to an alignment grating formed on the wafer at a specified position to enable interference fringes to be formed on said alignment grating and concurrently to an alignment grating formed on the reticle at a specified position to enable interference fringes to be formed on said alignment grating, a first optical sensor for sensing a heterodyne beat signal from ± primary light rays diffracted by the alignment grating on the reticle to produce interference, a second optical sensor for sensing a heterodyne beat signal from ± primary light rays diffracted by the alignment grating on the wafer to produce interference, a phase meter for detecting a phase difference between the respective heterodyne beat signals sensed by said first and second optical sensors, and position control means for detecting the position of the wafer relative to the reticle based on the phase difference between the respective heterodyne beat signals detected by said phase meter thereby to adjust the position of the reticle or the wafer.

In a preferred embodiment, the reticle and the wafer each have three alignment gratings for detecting alignment deviations relative to each other in X, Y, and θ directions, respectively, the θ direction being a direction which the wafer is rotatable about the Z axis.

In a preferred embodiment, the alignment deviation of said wafer relative to the reticle is detected at a position in which the circuit pattern on the reticle is imaged on the wafer so that the wafer is aligned with the reticle.

In a preferred embodiment, the alignment deviations of said wafer relative to the reticle in X, Y and θ directions are detected at positions at which the wafer is away a specified distance in said respective directions from the position at which the circuit pattern on the reticle is imaged on the wafer and subsequently the wafer is shifted to the imaging position, being then shifted in corresponding relation to the detected deviations so as to achieve alignment of the wafer and the reticle.

In a preferred embodiment, the optical alignment system comprises a light source emitting a light beam of a specified wavelength, a beam splitter for splitting the light of the specified wavelength into halves the planes of polarization of which are at right angles to each other and which have slightly different frequencies from each other, a reference grating for being illuminated by the light beam from the light source, means for selecting ± primary light rays diffracted by the reference grating, and means for directing said ± primary light rays to a diffracting grating of and windows in the reticle so as to produce two-beam interference fringes.

In a preferred embodiment, the ± primary light rays-selecting means comprises a pair of Fourier transform lenses and a filter.

In a preferred embodiment, the optical alignment system comprises a light source emitting a light beam of a specified wavelength, a beam splitter for splitting the light of the specified wavelength from the light source into halves, a pair of acoustooptic devices for modulating the respective frequencies of the halves of the light beam split by the beam splitter, and optical means for directing the light beam halves that have been frequency-modulated by the acoustooptic devices to the diffracting gratings and windows in the reticle.

Thus, the invention described herein makes possible the objectives of (1) providing an optical apparatus for use in alignment of a wafer and a reticle in connection with reduction projection exposure apparatuses, which achieves high precision alignment of the reticle and wafer; (2) providing an optical apparatus for use in alignment of a wafer and a reticle in connection with reduction projection exposure apparatuses in which an alignment grating on the wafer is imaged in reduced size on the wafer, and the pitch of the alignment grating is usually five times as large as that of an alignment grating provided on a mask in a proximity exposure apparatus, so that higher precision mounting of the alignment grating is possible; (3) providing an optical apparatus for use in alignment of a wafer and a reticle in connection with reduction projection exposure apparatuses in which, since the pitch of the alignment grating on the reticle is also larger, the optical system for directing light beams to the alignment grating need not be of high performance, it being possible to use a less expensive optical system; and (4) providing an optical apparatus for use in alignment of a wafer and a reticle in connection with reduction projection exposure apparatuses in which the fact that two beams are emitted simultaneously toward the respective alignment gratings on the reticle and on the wafer permits high throughput alignment.

BRIEF DESCRIPTION OF THE DRAWINGS

This invention may be better understood and its numerous objects and advantages will become apparent to those skilled in the art by reference to the accompanying drawings as follows:

FIG. 7 is a table showing the relationship between error factors and errors in the optical alignment apparatus in a TTR-on axis exposure apparatus.

FIG. 12 is a table showing error factors and errors in the optical alignment apparatus in a TTL-on axis exposure system.

DESCRIPTION OF THE PREFERRED EMBODIMENTS

Example 1

Figure 1:
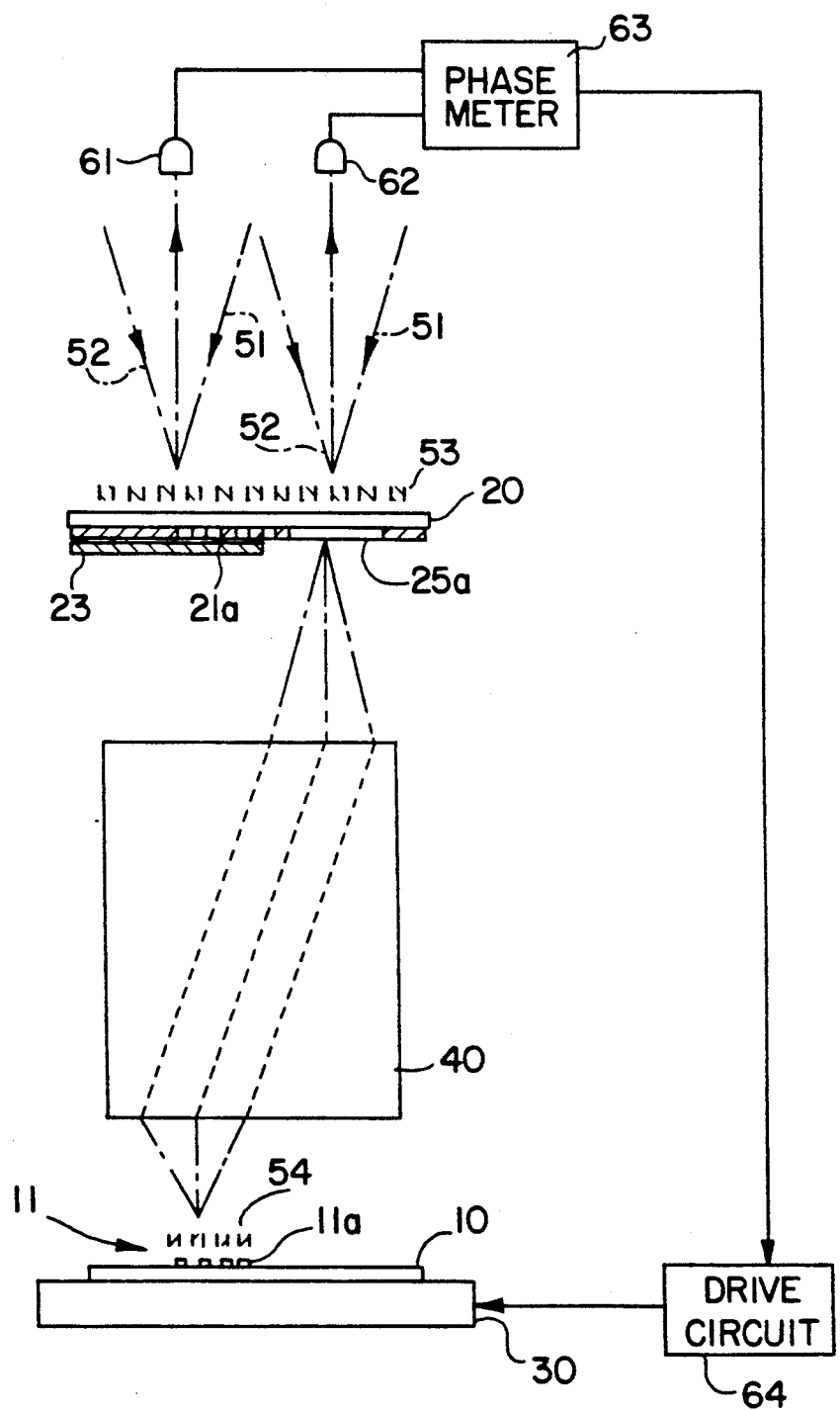
FIG. 1 is a schematic diagram showing an optical apparatus for aligning a reticle and a wafer in exposure apparatuses according to this invention.
Figure 2:
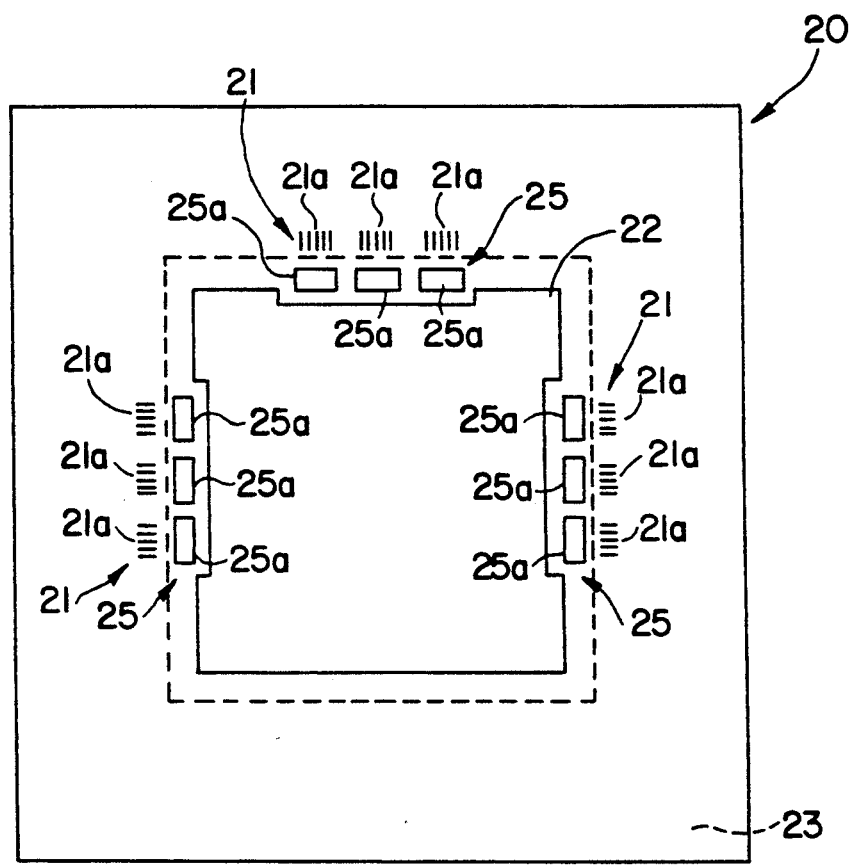
FIG. 2 is a plan view showing a reticle used in this invention.

FIG. 1 shows an alignment apparatus of the invention, which is used for alignment of a semiconductor wafer 10 and a reticle 20 in the reduction projection exposure technique. The semiconductor wafer 10 is mounted on a wafer stage 30. In the center of the reticle 20, as shown in FIG. 2, is provided a circuit pattern region 22 of a square configuration on which a required circuit pattern is formed. A reduction projection lens 40 is provided between the reticle 20 and the wafer 10 as shown in FIG. 1, and the circuit pattern region 22 (see FIG. 2) on the reticle 20 is imaged in a reduced size on the wafer 10 through the reduction projection lens 40. In this example, the reticle 20 and the wafer 10 are aligned with each other according to the TTR(through the lens)-on axis technique. The wafer stage 30 is shiftable in the X-Y-Z directions, rotatable about the X axis ($\alpha$ direction), adjustable about the Y axis ($\beta$ direction), and rotatable about the Z axis ($\theta$ direction).

The reticle 20 is formed with three separate groups of windows 25, as shown in FIG. 2. The three groups of windows 25 are located outside of the three linear peripheral edges, respectively, of the square circuit pattern region 22. Each window group 25 has three windows 25a and the windows 25a of the window group 25 is aligned along one of the three linear peripheral edges of the circuit pattern region 22. Each window group 25 is so formed that when the reticle 20 is exposed to light for projection onto an LSI chip region of the wafer 10, a projected image of the window group 25 is formed within the LSI chip region.

The reticle 20 is formed with three separate grating groups 21 each having three alignment gratings 21a on the outer side of the corresponding window groups 25 so that the individual gratings 21a of each grating group 21 make a pair with the corresponding windows 25a of the corresponding window group 25. Each alignment grating group 21 is used for the purpose of detecting off-alignment of the reticle 20 and wafer 10 in the X, Y and $\theta$ directions, wherein the $\theta$ direction is a direction which the wafer is rotatable about the Z axis.

The underside of a peripheral edge portion of the reticle 20 is covered with a light-shielding band 23. The light-shielding band 23 covers the alignment gratings 21a of each alignment grating group 21 only and not the windows 25a of each window group 25.

On the wafer 10 are also provided three alignment grating groups 11 (see FIG. 1). Each of the alignment grating groups 11 has three alignment gratings 11a. The alignment gratings 11a of each alignment grating group 11 are so formed that when a projected image of the corresponding windows 25a of the corresponding window group 25 of the reticle 20 is formed on the wafer 10 through the reduction projection lens 40, the alignment gratings 11a are positioned within the projected image portion of the corresponding windows 25a.

The alignment grating groups 21 and window groups 25 which are individually formed in pairs on the reticle 20 are, as shown in FIG. 1, subjected to exposure to two beams 51, 52 emitted from an optical alignment system (not shown). The respective frequencies of the two beams 51, 52 differ slightly from each other and the two beams 51, 52 can interfere with each other. The beams 51, 52 intersect each other on the alignment gratings 21a to produce interference fringes 53. The beams 51, 52 are diffracted by the alignment gratings 21a of the reticle 20, and as the resulting ± primary light rays which interfere with each other are emitted to an optical sensor 61 disposed above the reticle 20. The optical sensor 61 detects the intensity of the ± primary light rays from the alignment gratings 21a on the reticle 20.

The beams 51 and 52 emitted to the windows 25a of the window groups 25 pass through the reduction projection lens 40 after their passage through the windows 25a. The beams 51, 52 are projected in a reduced size onto the wafer 10 through the reduction projection lens 40 to produce interference fringes 54 on the alignment gratings 11a on the wafer 10. The beams are diffracted by the alignment gratings 11a of the wafer 10. The resulting ± primary light rays which interfere with each other are emitted to an optical sensor 62 disposed above the reticle 20 after their passage through the reduction projection lens 40 and the windows 25a on the reticle 20. This optical sensor 62 detects the intensity of heterodyne beat signals of the ± primary rays diffracted from the alignment gratings 11a on the wafer 10.

Outputs of the optical sensors 61 and 62 are given to a phase meter 63 which controls a drive circuit for the wafer stage 30 so that the difference in phase between the respective optical heterodyne beat signals detected by the optical sensors 61, 62 becomes zero.

Figure 3A:
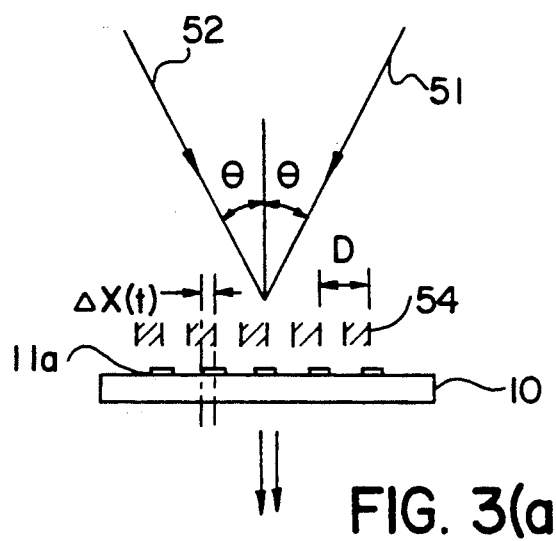
FIG. 3a is a schematic diagram showing the principle of the alignment of the optical apparatus of this invention.
Figure 3B:
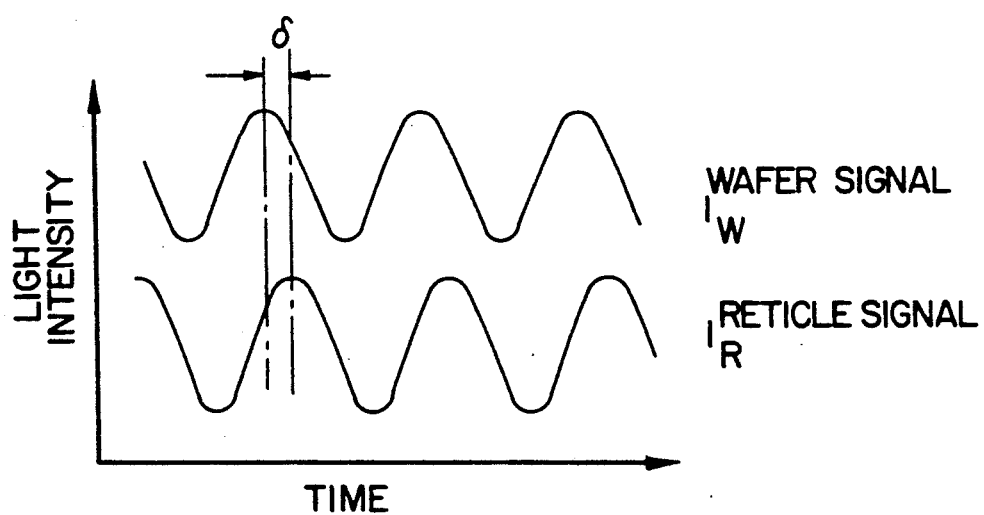
FIG. 3b is a graph showing heterodyne beat signals of both interference light rays from the alignment grating on the wafer and interference light rays from the alignment grating on the reticle of this invention.

The principle of the alignment apparatus of the present invention will be explained with reference to FIGS. 3a and 3b. Where two beams 51, 52 are $U_1$, $U_2$, their respective frequencies are $f_1$, $f_2$, and the angles of incidence of the two beams 51, 52 upon the wafer 10 are $\theta$, the pitch P of the interference fringes produced by the beams 51, 52 is given by the following equation:

$$P = \frac{\lambda}{2\sin\theta}$$

(wherein $\lambda$ represents the wavelength of interference light)

Where alignment gratings 11a are formed on the semiconductor wafer 10 at a pitch equal to or an integral multiple as large as the pitch of the interference fringes, the ± primary light rays $U_1$ (−1) and $U_2$ (1) diffracted by the alignment gratings of the wafer 10 are respectively represented by the following equations:

$$U_1(-1) = A(f_1) \exp\{i(2\pi f_1 t - \delta)\}$$

$$U_2(1) = A(f_2) \exp\{i(2\pi f_2 t - \delta)\}$$

wherein, $\delta$ represents a phase difference between the diffracted rays in the case where the gratings on the wafer are shifted $\Delta x_w$ and is expressed by the following equation:

$$\delta = \frac{\Delta x_w \sin\theta}{\lambda} \times 2\pi$$

The intensity of the ± interference primary light rays is expressed by the following equation:

$$\begin{aligned}
I_w &= |U_1(-1) + U_2(1)|^2 \\
&= A_w^2(f_1) + B_w^2(f_2) + \\
&\quad 2A_w(f_2)B_w(f_2)\cos\{2\pi(f_1 - f_2)t - 2\delta\} \\
&= A_w^2(f_1) + B_w^2(f_2) + \\
&\quad 2A_w(f_2)B_w(f_2)\cos 2\pi\{(f_1 - f_2)t - 2(\Delta x_w/P)\}
\end{aligned}$$

As is apparent from this equation, the intensity of the heterodyne beat signals detected by the optical sensors 61 and 62 includes relative displacement $\Delta x_w$ between the two-beam interference fringes and the gratings on the wafer.

Likewise, the intensity $I_R$ of interference light rays resulting from the diffraction of light incident on the alignment gratings 21a of the reticle 20 is expressed by the following equation:

$$I_R = A_R^2(f_1) + B_R^2(f_2) + 2A_R(f_2)B_R(f_2)\cos 2\pi\{(f_1-f_2)t - 2(\Delta x_R/P)\}$$

Therefore, by measuring the difference in phase between the interference light from the wafer 10 and the interference light from the reticle 20 by the phase meter, and then effecting alignment of the wafer 10 with the reticle 20 so that the phase difference becomes zero, it is possible to align the reticle 20 with the wafer 10 through the intermediary of interference fringes.

Figure 4:
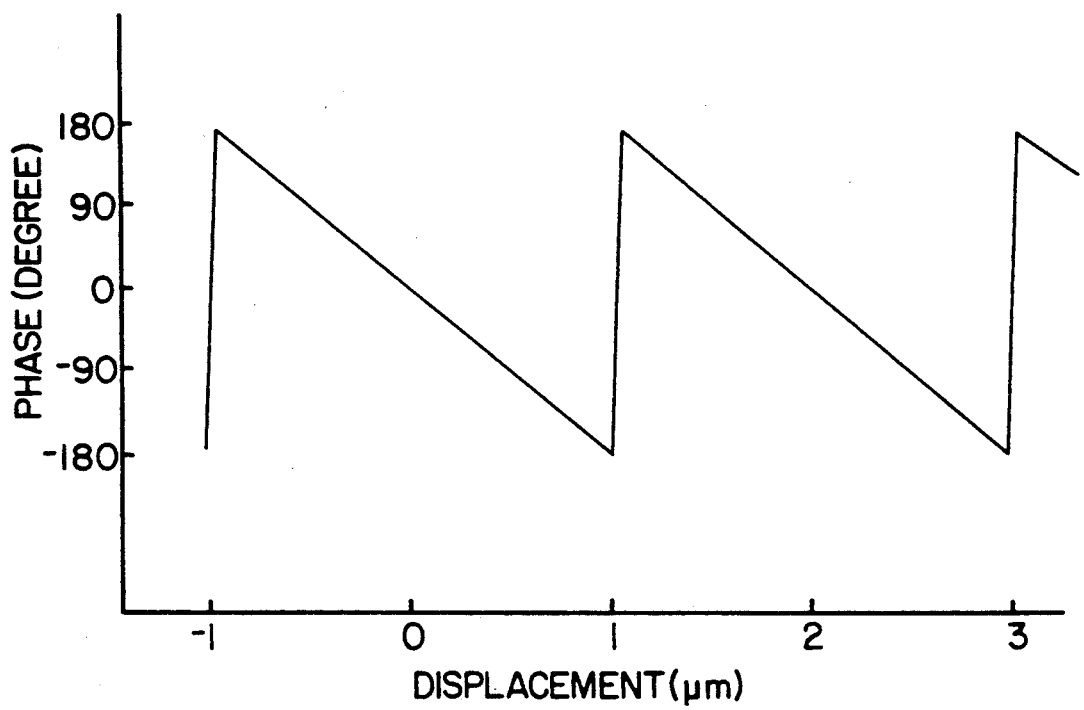
FIG. 4 is a graph showing phase changes in response to relative changes between the reticle and the wafer of this invention.

FIG. 4 shows the phase variations measured by the phase meter 63 when the wafer 10 is shifted relative to the reticle 20. Phase measurements by the phase meter 63 indicate phase changes which occur periodically depending upon the pitch of the interference fringes.

According to this invention, it is required that the two-beam interference fringes are formed in an area in which two beams intersect each other. Accordingly, the wavelength of light that is used for alignment is not needed to form an image on the wafer by means of the reduction projection lens, but it can be a wavelength that is different from the wavelength of light emitted from a light source for exposure.

Figure 5:
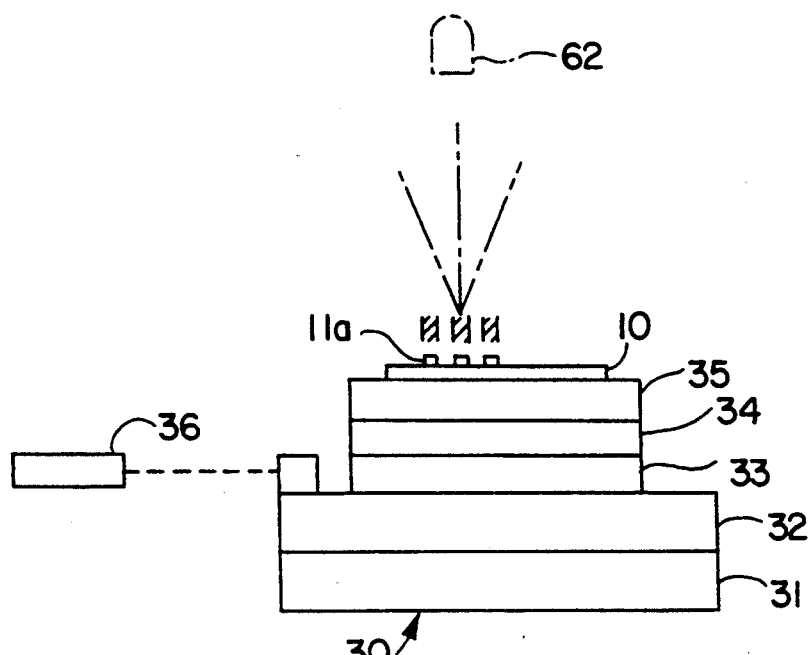
FIG. 5 is a schematic diagram showing a wafer stage of this invention.

The wafer stage 30 on which the wafer 10 is mounted, as shown in FIG. 5, includes an X-direction oriented rough-shifting stage 31 and a Y-direction oriented rough-shifting stage 32 placed on the X-direction oriented rough-shifting stage 31. On the Y-direction oriented rough-shifting stage 32 are mounted, one over another, an X-Y-$\theta$ direction fine adjuster stage 33, a Z-$\alpha$-$\beta$ direction drive stage 34, and a $\theta$-direction oriented rough-shifting stage 35 which are all made of a piezo-element. The wafer 10 is mounted on the $\theta$-direction oriented rough-shifting stage 35. A mirror 36 of a laser interferometric measuring instrument for detecting the position of the Y-direction oriented rough-shifting stage 32 is disposed on the Y-direction oriented rough-shifting stage 32.

Figure 6:
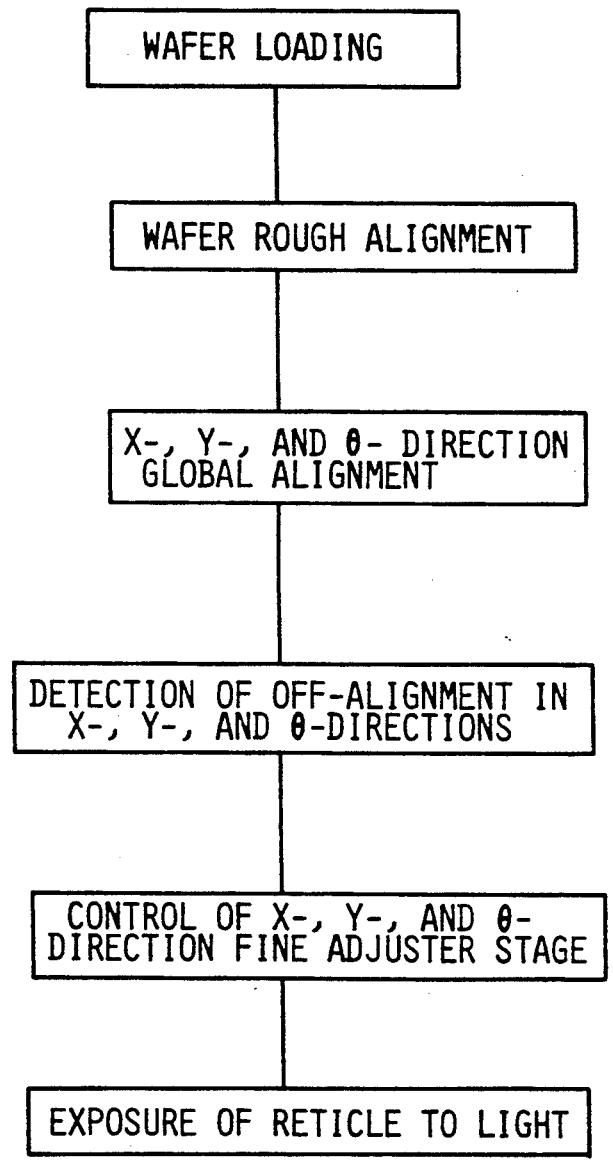
FIG. 6 is a flowchart showing the operation of the optical alignment apparatus of this invention.

The wafer stage 30 is driven by the output of the drive circuit 64. The drive circuit 64 is controlled on the basis of the results of detection by the phase meter 63. The operation of the wafer stage 30 driven by the drive circuit 64 is explained with reference to the flowchart shown in FIG. 6. The wafer 10 is first loaded on the $\theta$-direction oriented rough-shifting stage 35 (wafer loading) and then the entire wafer stage 30 is shifted to a position at which the circuit pattern on the reticle 2 is exposed to light from a light source (rough alignment). Such a rough alignment is effected by shifting the entire wafer stage 30 to a position at which, for example, a rough alignment mark given on the wafer 10 can be observed by a global microscope.

Then, the X-direction oriented rough-shifting stage 31, the Y-direction oriented rough-shifting stage 32, and the $\theta$-direction oriented rough-shifting stage 35 are driven to shift so as to permit alignment beams to be applied to the surface of the alignment gratings 11a on the wafer 10 (X-, Y- and $\theta$-direction global alignment). Such a global alignment is effected with an accuracy of the 0.5 $\mu$m order as in the global alignment practice in a conventional wafer process. In this global alignment stage, the Y-direction oriented rough-shifting stage 32 is shifted on the basis of the results of detection by the laser interferometric measuring instrument 36. Likewise, the X-direction oriented rough-shifting stage 31 is shifted on the basis of the results of detection by a laser interferometric measuring instrument thereon (not shown).

Subsequently, two beams are emitted toward the alignment gratings 21a of each alignment grating group 21 on the reticle 20, as well as toward the alignment gratings 11a of each alignment grating group 11 on the wafer 10, and as mentioned above, the difference in phase between the interference light from the alignment gratings 21a on the reticle 20 and the interference light from the alignment gratings 11a on the wafer 10 is detected by the phase meter 63. Then, the X-Y-$\theta$ direction fine adjuster stage 33 is driven so that the phase difference becomes zero. Thus, the reticle 2 and the wafer 1 are aligned with each other.

When the reticle 20 and the wafer 10 are aligned with each other in this way, exposure light is applied directly to the reticle 20 and accordingly an image of the circuit pattern on the reticle 20 is formed on the wafer 10.

Possible error factors involved in the alignment of the reticle 20 and the wafer 10 in the present embodiment were analyzed to find out the alignment accuracy (error) with respect to the reticle 20 and wafer 10, and the results as shown in FIG. 7 were obtained. For possible error factors, the following may be considered: repeatability of alignment by means of two-flux interference light, errors attributable to the manufacture of the alignment gratings, errors attributable to the control of the position of the X-direction oriented rough-shifting stage 31 and the Y-direction fine adjust stage 33, errors attributable to the control of the position of the $\theta$-direction oriented rough shifting stage 35, and errors attributable to the manufacture of the reticle itself. In the present embodiment, an image of the circuit pattern on the reticle 20 is projected onto the wafer 10 according to the TTR-on axis technique, so that there is no such error (alignment sequence error) as would otherwise occur when the stage 30 is shifted to the image forming position. Moreover there is no misalignment error due to a shift error of the $\theta$-direction oriented rough shifting stage, nor is there any error due to positional deviation (reticle rotation) caused at the time of reticle fixing, because triaxial alignment, that is, alignment in X-, Y-, and $\theta$-directions, is carried out. As a whole, the error involved was 50 nm/3$\sigma$.

Figure 8B:
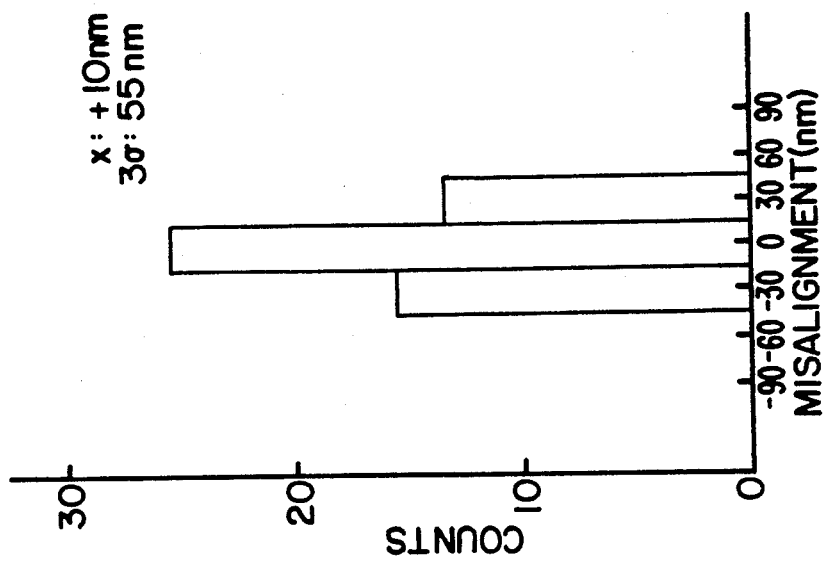
FIGS. 8a and 8b, respectively, are graphs showing precision of alignment.
Figure 8A:
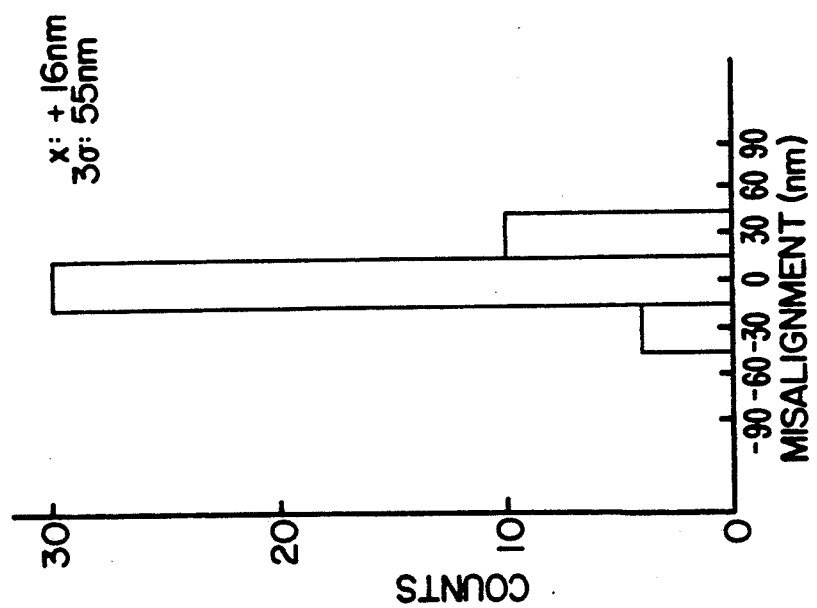

FIGS. 8a and 8b are histograms showing precision of alignment. Overlay accuracy is approximately 0.2 $\mu$m according to a conventional method, but it is less than 55 nm/3$\sigma$ according to this invention. Further, as to the Al deposited substrate with a rough surface, the alignment of less than 55 nm/3$\sigma$ precision is realized and those results include an measurement error in addition to the above-mentioned error factors.

Figure 9:
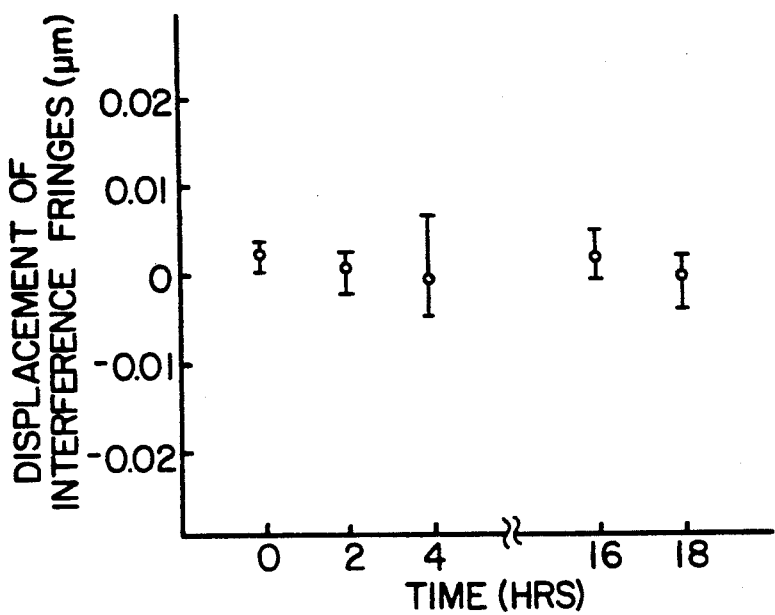
FIG. 9 is a graph showing changes with time of interference fringes used in this invention.

FIG. 9 is a graph showing the stability characteristics of a position at which the interference fringes utilized in the technique of the invention are formed. According to the technique of the invention, the degree of variation of a position at which the interference fringes are formed due to environmental changes was considerably low, that is, 10 nm or less after the lapse of 18 hours. Therefore, high precision alignment is possible even when the environmental condition is changed.

Figure 10:
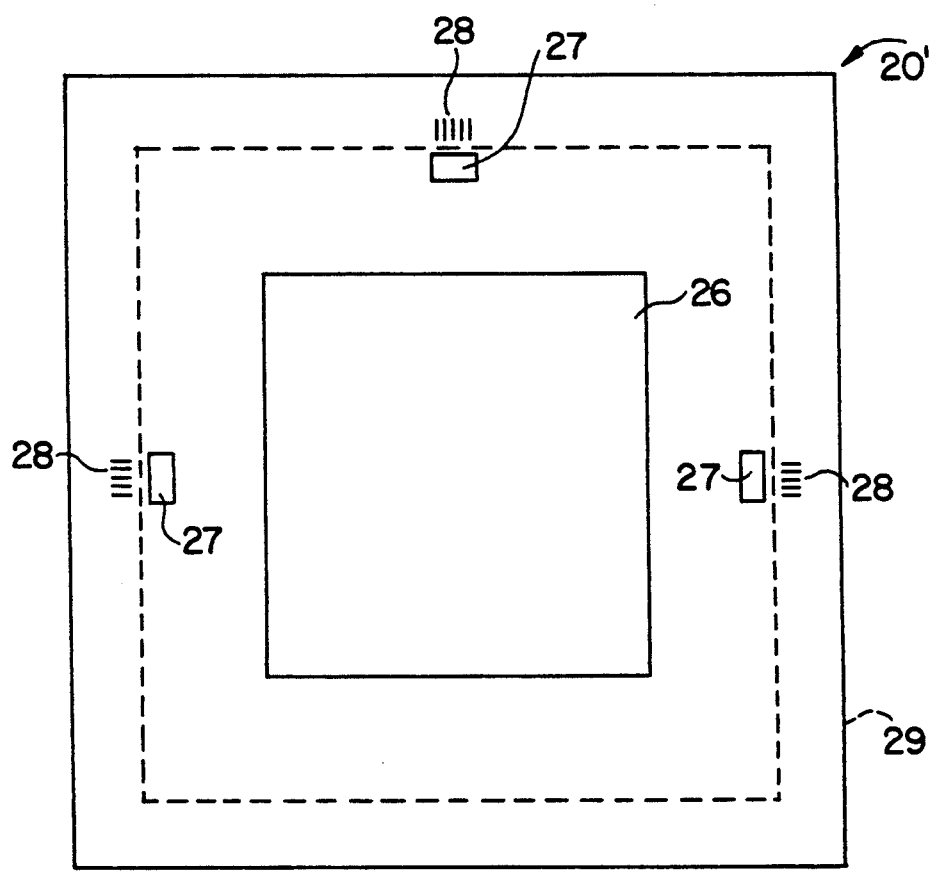
FIG. 10 is a plan view showing another reticle used in this invention.

In this way, according to the technique of the invention, precision alignment of such a high degree as 55 nm/3$\sigma$ can be achieved and, moreover, steady alignment is possible even when there is an environmental change. Therefore, the invention can achieve high throughput alignment and can be very advantageously applied for alignment purposes with respect to highly integrated semiconductor devices, such as 64 megabit drams.

Where the image of the circuit pattern on the reticle is projected on the wafer according to the TTL (through the lens)-off axis exposure technique and not according to the above described TTR-on axis exposure technique, a reticle 20' as shown in FIG. 10 is used. In the center of the reticle 20', there is formed a square circuit pattern region 26 in which a circuit pattern is to be formed. One window 27 is provided at a location outside each of three linear outer peripheral edges of the circuit pattern region 26. One alignment grating 28 is provided outside of the corresponding window 27. The wafer 10, as already mentioned, is formed with alignment grating groups 11 each having three alignment gratings 11a in the LSI chip region onto which an image of the circuit pattern is projected.

The under side of an outer peripheral edge portion of the reticle 20' is covered with a shielding band 29. The shielding band 29 covers the individual alignment gratings 28 but not the windows 27.

Figure 11:
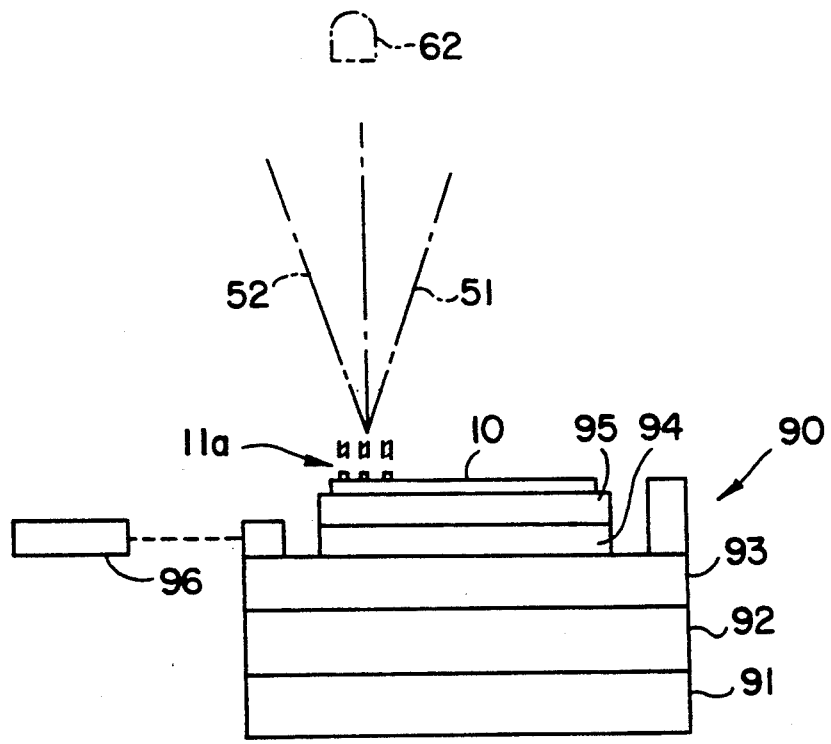
FIG. 11 is a schematic diagram showing another wafer stage used in this invention.

In a TTL-off axis exposure arrangement using such a reticle 20', a wafer stage 90 as shown in FIG. 11 is used. This wafer stage 90 includes an X-direction oriented rough shifting stage 91, a Y-direction oriented rough shifting stage 92 placed thereon, and an X-Y-$\theta$ direction fine shift stage 93 made of a piezo-element which is placed thereon in that order. On the X-Y-$\theta$ direction fine shift stage 93 are placed a Z-$\alpha$-$\beta$ direction drive stage 94 and a $\theta$-direction oriented rough shifting stage 95 in that order. The wafer 10 is mounted on the $\theta$-direction oriented rough shifting stage 95. A mirror 96 of a laser interferometric measuring instrument for detecting the position of the X-Y-$\theta$ direction fine shift stage 93 is disposed on the X-Y-$\theta$ direction fine shift stage 93.

Alignment of the reticle 20' with the wafer 10 is carried out in the following manner. The entire wafer stage 90 is first roughly placed at a position at which the image of the circuit pattern of the reticle 20' can be projected onto the wafer 10, and then the wafer stage 90 is shifted a specified distance from the position at which the circuit pattern on the reticle is imaged on the wafer on the basis of an indication given by a laser interferometric measuring instrument 46. Then, for example, the position of the alignment grating 11a on the wafer 10 for detecting an X-directional misalignment is adjusted to the position at which an image of the window 26 on the reticle 20' for detecting the X-directional position of the reticle 20' is projected onto the wafer 10. A possible alignment error in this case is of the order of 0.5 μm. In that condition, alignment beams are projected and, as already mentioned, the difference in phase between heterodyne beat signals is detected through the intermediary of two-beam interference fringes. Thus, any quantity of X-directional misalignment of the reticle 20' relative to the wafer 10 is detected.

Similarly, the entire wafer stage 90 is shifted a specified distance from the position for circuit pattern image projection, and respective alignment gratings 11a on the wafer 10 for detecting Y-direction misalignment and $\theta$-direction misalignment are shifted respectively to positions corresponding to respective alignment windows 26 on the reticle 20' for detecting Y-direction misalignment and $\theta$-direction misalignment, so that misalignment quantities in the Y- and $\theta$-directions between the reticle 20' and the wafer 10 are detected.

When misalignment quantities in X-, Y-, and $\theta$-directions between the reticle 20' and the wafer 10 are detected in this way, the entire wafer stage 90 is shifted on the basis of the measurements given by the laser interferometric instrument 96, being then disposed at an initial exposure position. At this position, rough adjustment of the position of the wafer stage 90 relative to the reticle 20' is made, and then the X-Y-$\theta$ direction fine shift stage 93 is driven so as to correct the positional deviations in the X-, Y-, and $\theta$-directions which have been measured, the wafer 10 being thus aligned with the reticle 20'. When the wafer 10 has been aligned with the reticle 20', the circuit pattern on the reticle 20' is exposed to light so that its image is projected onto the wafer 10. Instead of the shifting of the wafer stage 90, the shifting of the reticle 20' can be performed, which also achieves the same effects as mentioned above.

Error factors involved in the alignment between the reticle 20' and the wafer 10 were analyzed, the results of which are shown in FIG. 12. In this case, unlike the case in which the TTR-on axis exposure technique is employed, the wafer stage 90 as a whole is shifted in X, Y and $\theta$ directions for the purpose of detecting misalignment quantities with respect to the reticle 20' and the wafer 10. Therefore, an error (alignment sequence error) of the order of 30 nm/3$\sigma$ occurs as a result of the shifting of the wafer stage 90. Other error factors are similar to those involved in the case of the TTR-on axis exposure technique being used, except that there occurs a slight increase in the amount of error involved in the shift of the X- and Y-direction rough-shifting stages. As a result, the total error is 62 nm/3$\sigma$ or slightly lower than the alignment accuracy observed in the case of the TTR-on axis system. Nevertheless, no limitation is imposed on the position for formation of alignment gratings in the wafer, it being possible to form the gratings at any desired positions. Therefore, it is possible to arrange so that the region for exposure of the circuit pattern to light from the light source for image projection onto the wafer is not narrowed by alignment light beams.

Example 2

Figure 13:
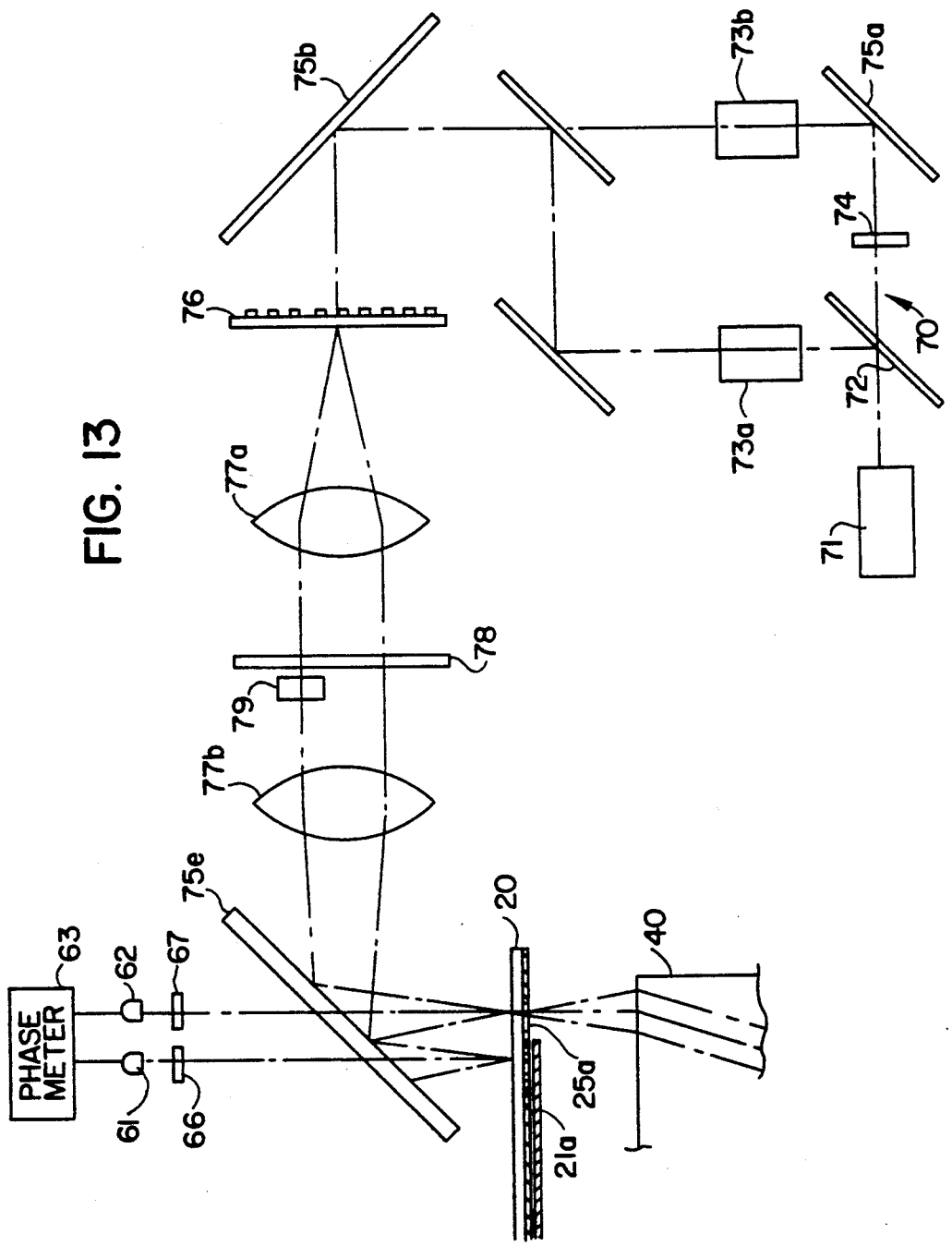
FIG. 13 is a schematic diagram showing an optical alignment system used in this invention.

In an arrangement employing the TTR-on axis exposure technique, as shown in FIG. 13, alignment light beams from an optical alignment system 70 are applied to the reticle 20. The optical alignment system 70 includes a laser beam source 71 which emits a laser beam. A laser beam emitted from the laser beam source 71 is applied to a beam splitter 72 which splits the laser beam into halves. One of the halves of the laser beam split by the beam splitter 72 is frequency-modulated by a first acoustooptic element 73a into a light beam having a predetermined frequency. The other half of the laser beam has its plane of polarization rotated 90° by a $\lambda/2$ plate 74 and, after it is reflected by a mirror 75a, the beam is applied to a second acoustooptic element 73b, by which it is modulated into a light beam having a specified frequency. This second acoustooptic element 73b modulates the frequency of the laser beam applied thereto into a frequency slightly different from the frequency resulting from the modulation by the first acoustooptic element 73a. The respective laser beams which have passed through the first and second acoustooptic elements 73a and 73b are joined in superposed relation by a mirror 75b and applied to a reference grating 76. The two laser beams applied to the reference grating 76 are amplitude-separated. The respective amplitude-separated laser beams are applied to a pair of Fourier transform lenses 77a and 77b. Between the Fourier transform lenses 77a and 77b is disposed a spatial filter 78 by which ± primary light rays of each of the laser beams are selected. One of the laser beams which was passed through the spatial filter 78 has its plane of polarization rotated 90° by a $\lambda/2$ plate 79. The respective laser beams are reflected by a reflecting mirror 75e so that they are applied respectively to a specified alignment grating 21a and a specified window 25a both provided on the reticle 20. Interference light rays resulting from diffraction by the alignment grating 21a of the reticle 20 are applied to an optical sensor 61 after passing through the reflecting mirror 75e and a polarizing element 66. Interference light rays resulting from diffraction by the alignment gratings 11a are applied to an optical sensor 62 after passing through the reflecting mirror 75e and a polarizing element 67. In same way as in the foregoing embodiment, the difference in phase between heterodyne beat signals detected by the respective optical sensors 61 and 62 is detected by a phase meter 63 and thus alignment of the reticle 20 with the wafer 10 is carried out through the intermediary of two-beam interference fringes.

In this embodiment, the pitch of the two-beam interference fringes is one half of the pitch of the reference gratings 76, and accordingly the pitch of the two-beam interference fringes can be accurately set. The pitch of the two-beam interference fringes can be easily changed by changing the pitch of the reference gratings or by changing the position of the spatial filter 78 disposed between the pair of Fourier transform lenses 77a and 77b. Where two gratings, i.e., X-direction oriented and Y-direction oriented gratings, are used as reference gratings, the two laser beams can be each split into halves by the respective gratings, and accordingly X-directional misalignment and Y-directional misalignment can be concurrently detected.

Example 3

Figure 14:
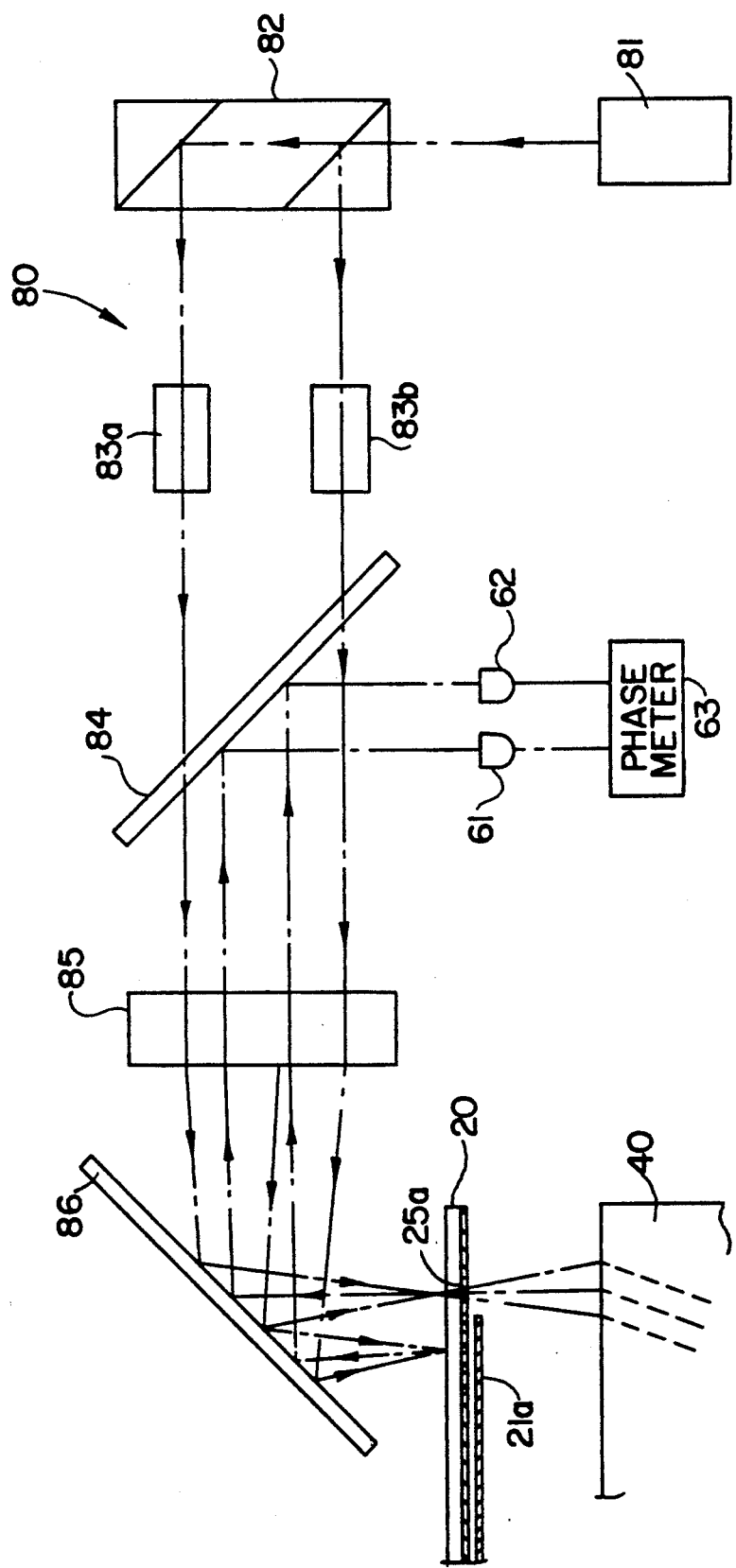
FIG. 14 is a schematic diagram showing another optical alignment system used in this invention.

In this embodiment, as FIG. 14 shows, an optical alignment system 80 includes a laser beam source 81 which emits a laser beam having a specified wavelength. The laser beam emitted from the laser beam source 81 is split into two beams by a beam splitter 82, and the respective laser beams are applied to a first acoustooptic element 83a and a second acoustooptic element 83b. The laser beams, frequency modulated by the acoustooptic elements 83a and 83b respectively, are applied to a specified alignment grating and a specified alignment window both on the reticle 20 by a mirror 86 after their passage through a half mirror 84 and then through a group of lenses 85. Interference light rays resulting from diffraction by the alignment gratings on the reticle 20, as well as interference light rays resulting from diffraction by the alignment gratings on the wafer 10, are reflected by a mirror 86 to be applied to the respective optical sensors 61 and 62 after passing through the lens group 85 and being reflected by the mirror 84. The output of each of the optical sensors 61, 62 is applied to a phase meter 63. Heterodyne beat signals of the interference light rays are detected by the phase meter 63.

In this embodiment, the direction of polarization of the laser beam emitted from and split by the beam splitter 82 is constant, and therefore, the laser beams are free from inclusion of different planes of polarization. Thus, there is no possibility of the phase characteristics of the heterodyne beat signals being affected by such inclusion. This permits high precision alignment of the reticle 20 with the wafer 10.

Figure 15:
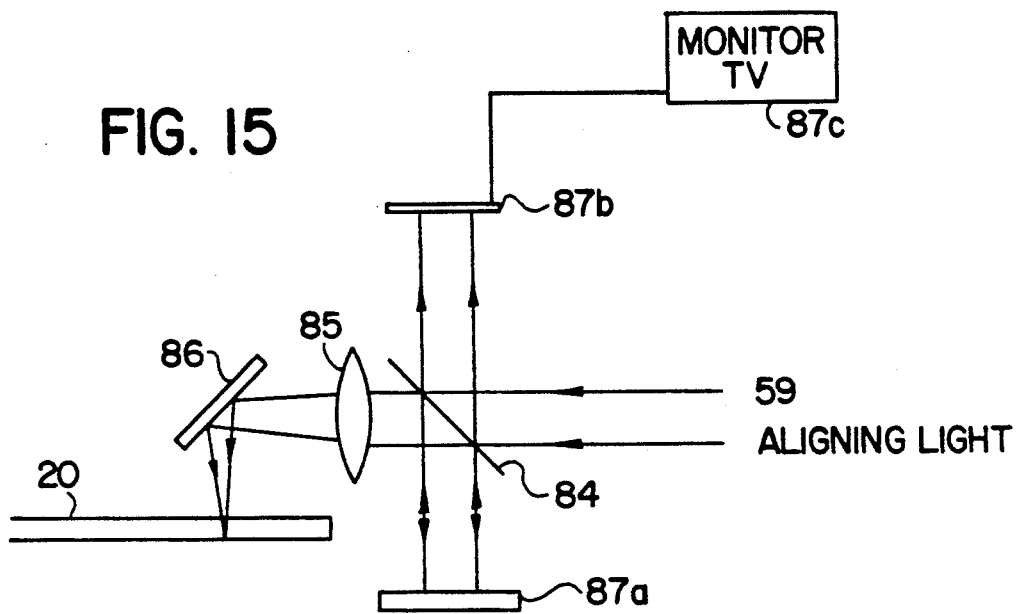
FIG. 15 is an illustration for explanation of the manner of adjustment of the optical alignment system of FIG. 14.

The optical alignment system 80 of this embodiment is adjusted in such manner as shown by way of example in FIG. 15. For the purpose of adjusting the optical alignment system 80, a pair of alignment beams applied to the reticle 20, or a pair of parallel beams applied to the reticle 20 through a similar route to that of the alignment beams are applied to the surface of the reticle 20 by the half mirror 84, lens group 85, and the mirror 86, and the light reflected by the reticle 20 is applied to the half mirror 84 by the mirror 86 and lens group 85. Then, the light is applied to a mirror 87a by the half mirror 84 to cause it to be reflected by the mirror 87a so that it is again applied to the reticle 20 by the half mirror 84, lens group 85 and mirror 86. The spot position of the light in this case is projected from the acoustooptic elements 83a and 83b (FIG. 14) and accordingly the lens group 85 and the mirror 86 are adjusted so that they agree with the spot position of the light projected directly onto the reticle 20 by the half mirror 84, lens group 85, and mirror 86.

When the mirror 86 and the lens group 85 are adjusted in this way, a pair of parallel light beams are likewise applied to the reticle 20 through the half mirror 84, lens group 85, and mirror 86. The light reflected by the reticle 20 is conducted to the half mirror 84 via a similar but reverse route, and interference fringes resulting from the interference of light beams split by the half mirror 84 with light incident on the half mirror 84 are caught by a CCD image sensor 87b not shown. The interference fringes are displayed on a monitor TV 87c and then the lens group 85 and the mirror 86 are adjusted so that the interference fringes are clearly seen.

Figure 16:
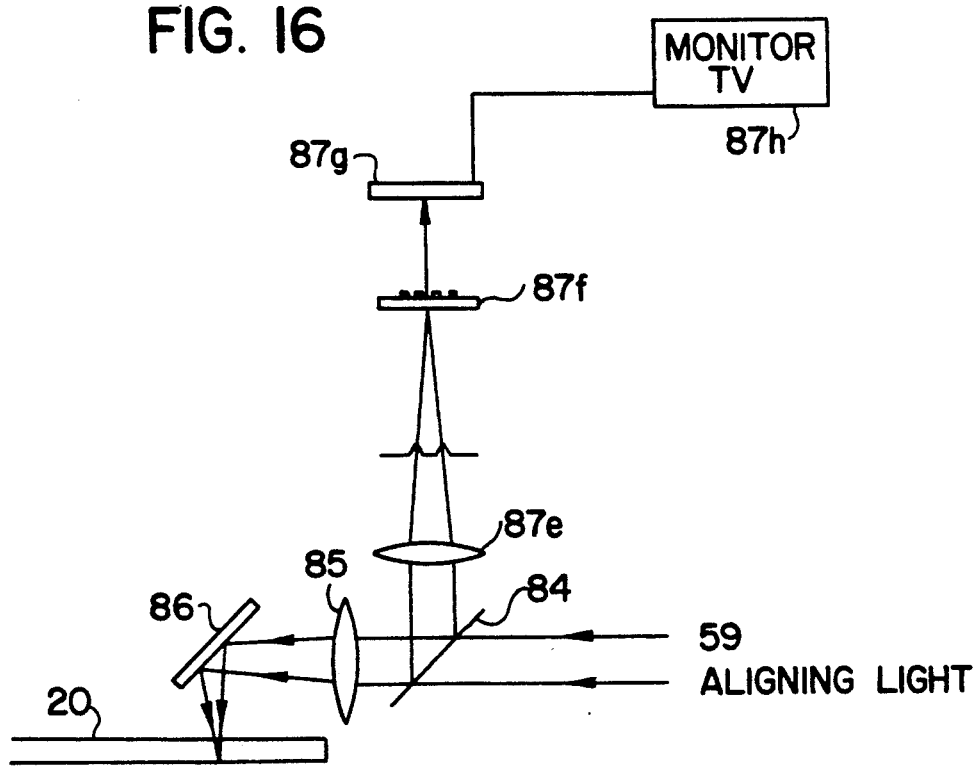
FIG. 16 is an illustration for explanation of another way of adjustment of the optical alignment system of FIG. 14.
Figure 17:
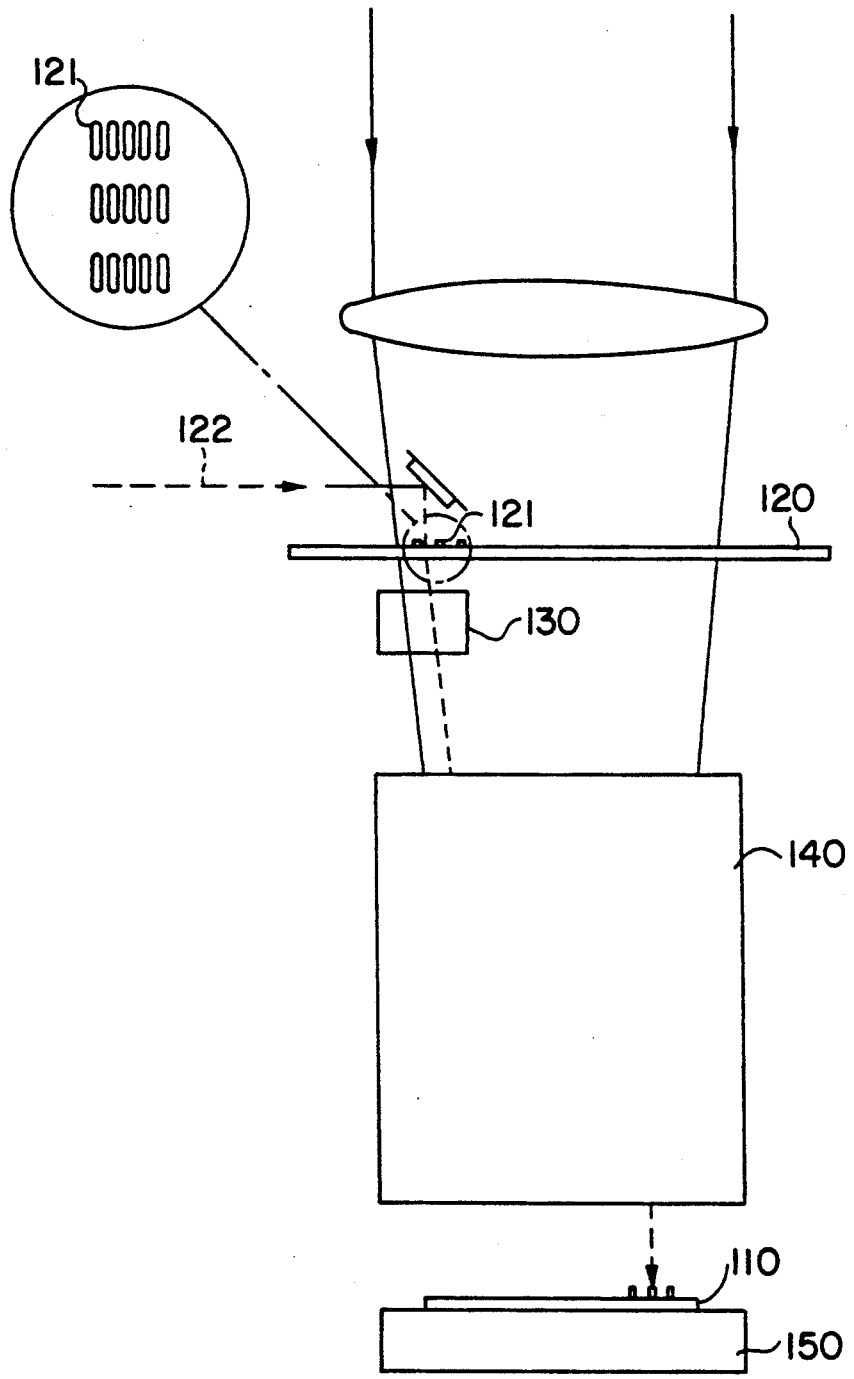
FIG. 17 is a schematic diagram showing a conventional optical alignment system.
Figure 18B:
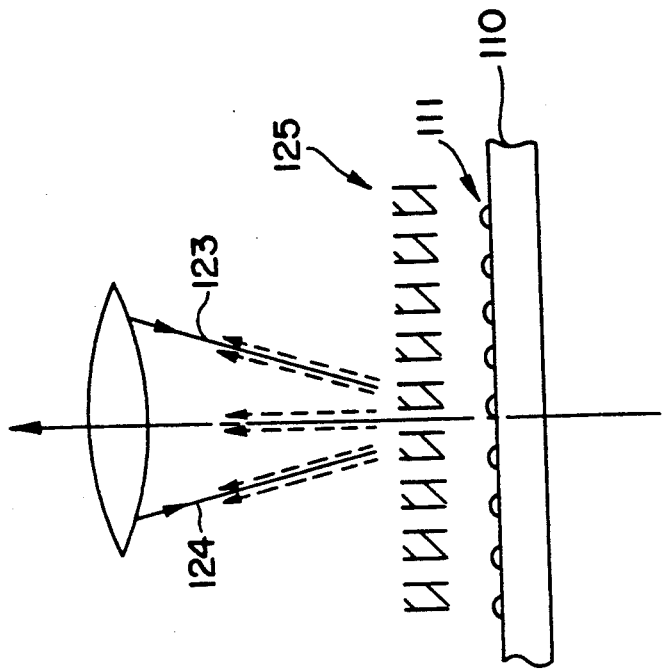
FIG. 18b is an illustration for explanation of the principle of the conventional optical alignment system of FIG. 17.
Figure 18A:
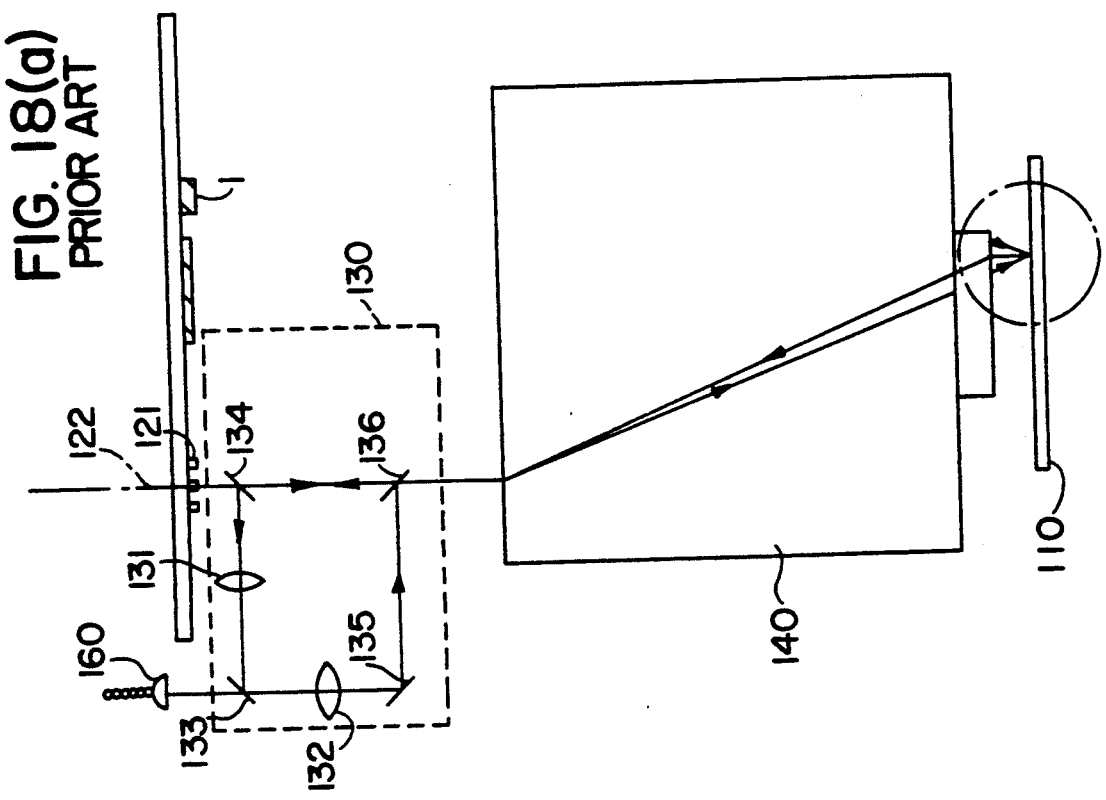
FIG. 18a is a schematic diagram showing the main part of the conventional optical alignment system of FIG. 17.
Figure 19:
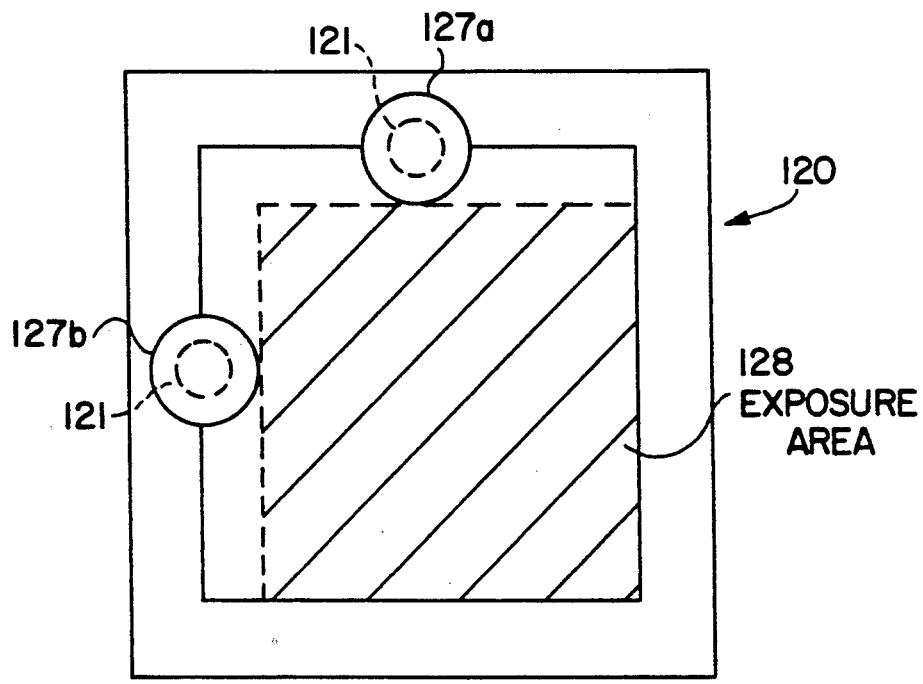
FIG. 19 is a plan view of a reticle used in the conventional optical alignment system of FIG. 17.
Figure 21:
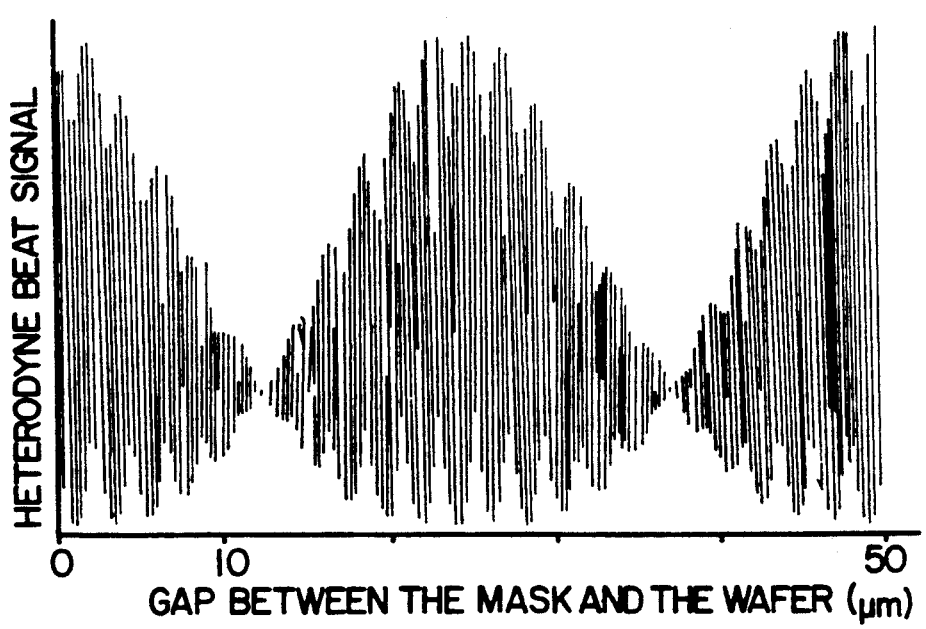
FIG. 21 is a graph showing the relationship between the gap between the mask and the wafer and the intensity of heterodyne beat signals.
Figure 20:
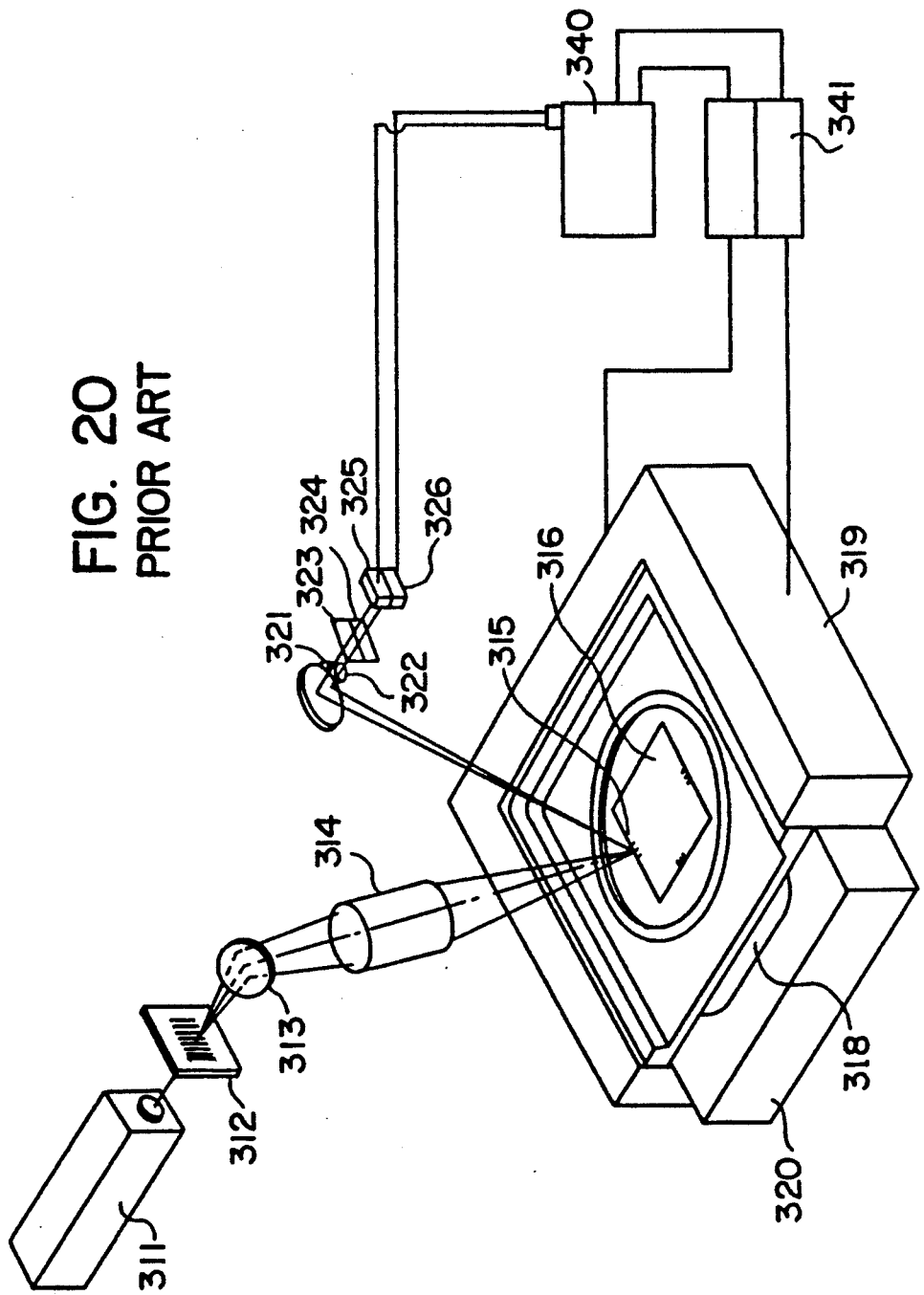
FIG. 20 is a schematic diagram showing another conventional optical alignment system.
Figure 22:
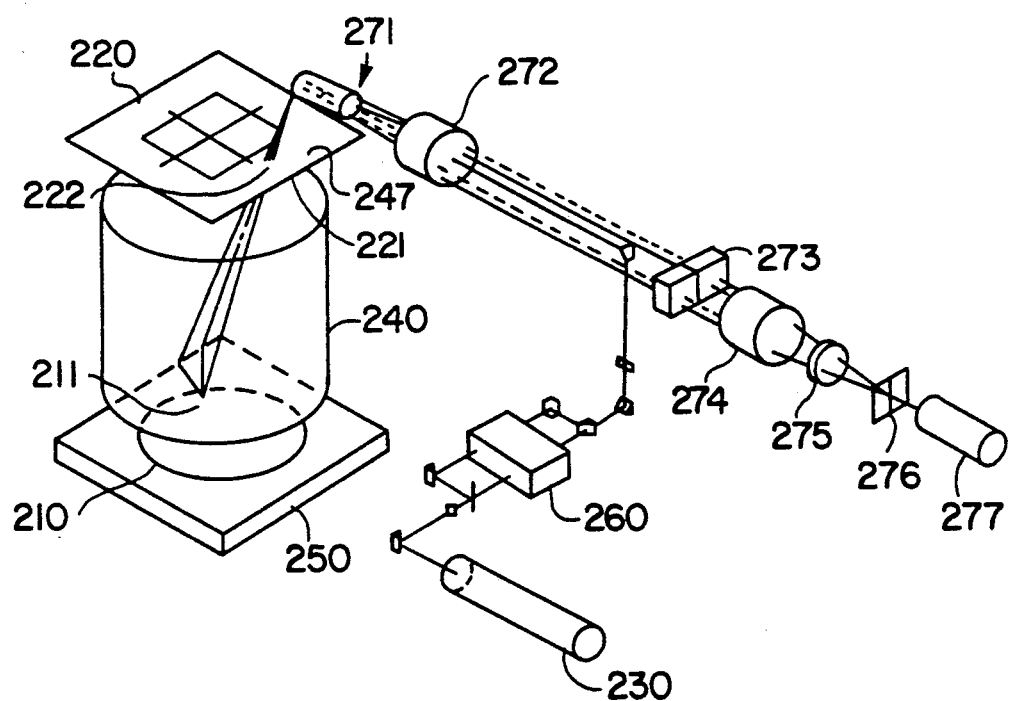
FIG. 22 is a schematic diagram showing still another conventional optical alignment system.

Another way of adjustment with respect to the optical alignment system shown in FIG. 16 will be explained. According to this adjustment method, the light reflected by the reticle 20 is split by the half mirror 84 for passage through an image forming lens 87e. The light which has passed through the image forming lens 87e is diffracted by a diffracting grating 87f and the diffracted light is applied to a CCD image sensor 87g. For the image forming lens 87e a lens is used which has the same optical performance characteristics as the image forming lens 85 used in the optical alignment system 80. For the diffracting grating 87f, a grating is used which is similar to the reference grating 76 used in the optical alignment system 70 shown in FIG. 13. The respective positions of the image forming lens 87e, diffracting grating 87f, and CCD image sensor 87g are determined by a three-dimensional acoustooptic instrument (not shown). The two beams resulting from splitting by the half mirror 84 of the light reflected from the reticle 20 are projected onto the diffracting grating 87f through the image forming lens 87e by which two-beam interference fringes are produced. Moire fringes are produced between the interference fringes and the diffracting grating 87f. The Moire fringes are caught by the CCD image sensor 87g to be displayed on a monitor television 87h, and the mirror 86 and the image forming lens 85 are adjusted so that the Moire fringes are reduced to a single fringe.

In this way, this embodiment permits easy adjustment of the optical alignment system not labeled, and hence high precision alignment between the reticle 20 and the wafer 10 can be achieved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An optical apparatus for aligning a reticle and a wafer with each other in connection with reduction projection onto the wafer of a circuit pattern formed on the reticle, comprising:

an optical alignment system for directing two alignment-oriented beams having a wavelength different from that of reduction projection exposure light, slightly differing in frequency and able to interfere with each other, through windows provided in the reticle and further through a reduction projection lens, to three alignment gratings formed on the wafer at a specified position to enable interference fringes to be formed on said alignment grating and concurrently to three alignment gratings of a reflection type formed on the reticle at a specified position to enable interference fringes to be formed on said alignment grating, wherein said respective three alignment gratings on said wafer and said reticle are adapted for detecting alignment deviations relative to each other in X, Y and $\theta$ directions, respectively, said $\theta$ direction being a direction which said wafer is rotatable about the Z axis, a first optical sensor which senses a heterodyne beat signal for the purpose of detecting a position of a reticle grating from $\pm$ primary light rays diffracted by the alignment grating on the reticle to produce interference, a second optical sensor which senses a heterodyne beat signal for the purpose of detecting a position of a wafer grating from $\pm$ primary light rays diffracted by the alignment grating on the wafer to produce interference, a phase meter for detecting a phase difference between the respective heterodyne beat signals sensed by said first and second optical sensors, and position control means for detecting the position of the wafer relative to the reticle base on the phase difference between the respective heterodyne beat signals detected by said phase meter thereby to adjust the position of the reticle or the wafer.

2. An optical apparatus according to claim 1, wherein an alignment deviation of said wafer relative to the reticle is detected at a position in which the circuit pattern on the reticle is imaged on the wafer so that the wafer is aligned with the reticle.

3. An optical apparatus according to claim 1, wherein alignment deviations of said wafer relative to the reticle in X, Y and $\theta$ directions are detected at positions at which the wafer is away a specified distance in said respective directions from the position at which the circuit pattern on the reticle is imaged on the wafer and subsequently the wafer is shifted to the imaging position, being then shifted in corresponding relation to the detected deviations so as to achieve alignment of the wafer and the reticle.

4. An optical apparatus according to claim 1, wherein said optical alignment system comprises a light source which emits a light beam of a specified wavelength;

a splitter for the light beam emitted from the light source into two beams;

a pair of accoustooptic elements for modulating the frequency of the split light beams;

means for producing interference fringes by interfering a part of the light beams illuminated onto the reticle with the light beams reflected on the reticle; and means for picking up the image of produced interference fringes, wherein the position of illuminating the two light beams on the reticle is adjusted based on the picked-up image of the interference fringes.

5. An optical apparatus for aligning a reticle and a wafer with each other in connection with reduction projection onto the wafer of a circuit pattern formed on the reticle, comprising:

a light source which emits a light beam of a specified wavelength;

a reference grating for being illuminated by the light beam from the light source and producing two light beams which are slightly different in frequency from each other;

means for selecting $\pm$ primary light rays from the two light beams produced on the reference grating;

a polarizing element, which is provided on at least one of the optical paths of the respective selected $\pm$ primary light rays, for polarizing light beams of the optical paths;

means for directing the $\pm$ primary light rays, through windows in the reticle and further through a reduction projection lens, to an alignment grating formed on the wafer at a specified position to enable interference fringes to be formed on the alignment grating and concurrently to an alignment grating formed on the reticle at a specified position to enable interference fringes to be formed on the alignment grating;

a first optical sensor for sensing a heterodyne beat signal from the $\pm$ primary light rays diffracted by the alignment grating on the reticle;

a second optical sensor for sensing a heterodyne beat signal from the $\pm$ primary light rays diffracted by the alignment grating on the wafer;

a phase meter for detecting a phase difference between the respective heterodyne beat signals sensed by the first and second sensors; and position control means for detecting the position of the wafer relative to the reticle based on the phase difference between the respective heterodyne beat signals detected by the phase meter, thereby adjusting the position of the reticle or the wafer.

6. An optical apparatus for aligning a reticle and a wafer with each other in connection with reduction projection onto the wafer of a circuit pattern formed on the reticle, comprising:

a light source for emitting a light beam of a specified wavelength;

a splitter for splitting the light beam emitted from the light source into two beams;

a pair of accoustooptic elements for modulating the frequency of the split light beams, an optical system for illuminating the frequency modulated light beams to an alignment grating formed on the reticle and an alignment grating formed on the wafer through windows in the reticle and a reduction projection lens formed on the reticle;

means for adjusting the position of the wafer relative to the reticle based on the phase difference between the respective heterodyne beat signals of the respective $\pm$ primary light rays of the fringes generated on the respective alignment gratings;

a reference grating to which the two light beams reflected on the reticle and passing through the optical system are illuminated to produce two light beam interference fringes; and means for picking up the image of Moire interference fringes which are generated by the reference grating and two light beam interference fringes produced by the reference grating, wherein the position of illuminating the two light beams on the reticle is adjusted based on the picked-up image of the Moire fringes.

* * * * *